United States Patent
Kim

(10) Patent No.: US 11,251,111 B2
(45) Date of Patent: Feb. 15, 2022

(54) LEADFRAME IN PACKAGES OF INTEGRATED CIRCUITS

(71) Applicant: Intel Corporation, Santa Clara, CA (US)

(72) Inventor: Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 16/637,556

(22) PCT Filed: Sep. 20, 2017

(86) PCT No.: PCT/US2017/052489
§ 371 (c)(1),
(2) Date: Feb. 7, 2020

(87) PCT Pub. No.: WO2019/059904
PCT Pub. Date: Mar. 28, 2019

(65) Prior Publication Data
US 2020/0235044 A1    Jul. 23, 2020

(51) Int. Cl.
*H01L 23/495* (2006.01)
*H01L 23/00* (2006.01)
(Continued)

(52) U.S. Cl.
CPC .. *H01L 23/49568* (2013.01); *H01L 23/49541* (2013.01); *H01L 23/49575* (2013.01);
(Continued)

(58) Field of Classification Search
CPC ....... H01L 23/49568; H01L 2225/1094; H01L 23/3107; H01L 25/0657; H01L 23/49541;
(Continued)

(56) References Cited

U.S. PATENT DOCUMENTS 6,462,410 B1 *  10/2002  Novotny ................. H01L 23/34
                                                          257/704
2004/0094826 A1   5/2004  Yang et al.
(Continued)

FOREIGN PATENT DOCUMENTS

KR     20100051270 A    5/2010
KR     20140073711 A    6/2014

OTHER PUBLICATIONS

International Patent Office—International Search Report and Written Opinion dated Feb. 26, 2018, from International Application No. PCT/US2017/052489, 13 pages.

*Primary Examiner* — Jasmine J Clark
(74) *Attorney, Agent, or Firm* — Schwabe, Williamson & Wyatt, P.C.

(57) ABSTRACT

Embodiments include apparatuses, methods, and systems that may include a leadframe of a circuit package to conduct heat generated by an integrated circuit (IC) included in the circuit package, while being a part of an interconnect of the circuit package. In various embodiments, a circuit package may include a package substrate, and an IC attached to the package substrate. A leadframe may be disposed on the IC to conduct heat generated by the IC. In addition, the leadframe may be a part of an interconnect of the circuit package, and the leadframe may be electrically coupled to a component of the IC. Other embodiments may be described and/or claimed.

20 Claims, 8 Drawing Sheets

(51) Int. Cl.
*H01L 25/065* (2006.01)
*H01L 25/16* (2006.01)
*H01L 25/00* (2006.01)

(52) U.S. Cl.
CPC ........ *H01L 23/49579* (2013.01); *H01L 24/27* (2013.01); *H01L 24/32* (2013.01); *H01L 24/33* (2013.01); *H01L 24/48* (2013.01); *H01L 24/73* (2013.01); *H01L 24/83* (2013.01); *H01L 25/0657* (2013.01); *H01L 25/16* (2013.01); *H01L 25/50* (2013.01); *H01L 2224/32145* (2013.01); *H01L 2224/32245* (2013.01); *H01L 2224/33181* (2013.01); *H01L 2224/48091* (2013.01); *H01L 2224/48106* (2013.01); *H01L 2224/48227* (2013.01); *H01L 2224/73215* (2013.01); *H01L 2224/73265* (2013.01); *H01L 2225/0651* (2013.01); *H01L 2225/06562* (2013.01); *H01L 2225/06586* (2013.01); *H01L 2225/06589* (2013.01)

(58) Field of Classification Search
CPC ............... H01L 24/48; H01L 24/73; H01L 2224/32245; H01L 2224/32145; H01L 23/49575; H01L 2224/73265; H01L 24/32; H01L 2224/83; H01L 24/16; H01L 24/83
See application file for complete search history.

(56) References Cited

U.S. PATENT DOCUMENTS

| | | |
|---|---|---|
| 2005/0224954 A1 | 10/2005 | Kelly |
| 2010/0091472 A1 | 4/2010 | Kummerl et al. |
| 2011/0291249 A1* | 12/2011 | Chi ................ H01L 21/561 257/675 |
| 2011/0304032 A1* | 12/2011 | Ramos ............... H01L 24/37 257/675 |

* cited by examiner

LEADFRAME IN PACKAGES OF INTEGRATED CIRCUITS

CROSS REFERENCE TO RELATED APPLICATIONS

The present application is a national phase entry under 35 U.S.C. § 371 of International Application No. PCT/US2017/052489, filed Sep. 20, 2017, entitled "LEADFRAME IN PACKAGES OF INTEGRATED CIRCUITS", which designated, among the various States, the United States of America. The disclosure of International Application No. PCT/US2017/052489 is hereby incorporated by reference in its entirety.

FIELD

Embodiments of the present disclosure relate generally to the technical field of electronic circuits, and more particularly to integrated circuit (IC) packages.

BACKGROUND

An integrated circuit (IC), often called a silicon chip, a computer chip, an IC chip, or a chip, may be a piece of silicon or another semiconductor into which an electronic circuit is etched using photographic techniques or other techniques. ICs may be produced in batches on a wafer. A wafer may be cut ("diced") into pieces along dicing streets. Each of these pieces may be called a die. An IC, e.g., a die or a wafer, may be assembled into a circuit package. A circuit package may be an interface between an IC and a printed circuit board (PCB). A circuit package may be attached either to a PCB or to another substrate, to be coupled with other circuits to form an electronic system. An electronic system may become smaller with higher density, driving by the desire of size reduction for the end products, and the technology improvement in continual reductions in minimum feature size. ICs in a smaller and higher density electronic system may have increased thermal output. Thick die attach film (DAF) may be used as an insulation layer to increase thermal resistance between a hot IC that generates heat and adjacent ICs. DAF insulation layers may help preventing or delaying the direct thermal conduction from a hot IC to adjacent ICs. Unfortunately, DAF insulation layers may also prevent the heat generated by the hot IC dissipating to a substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
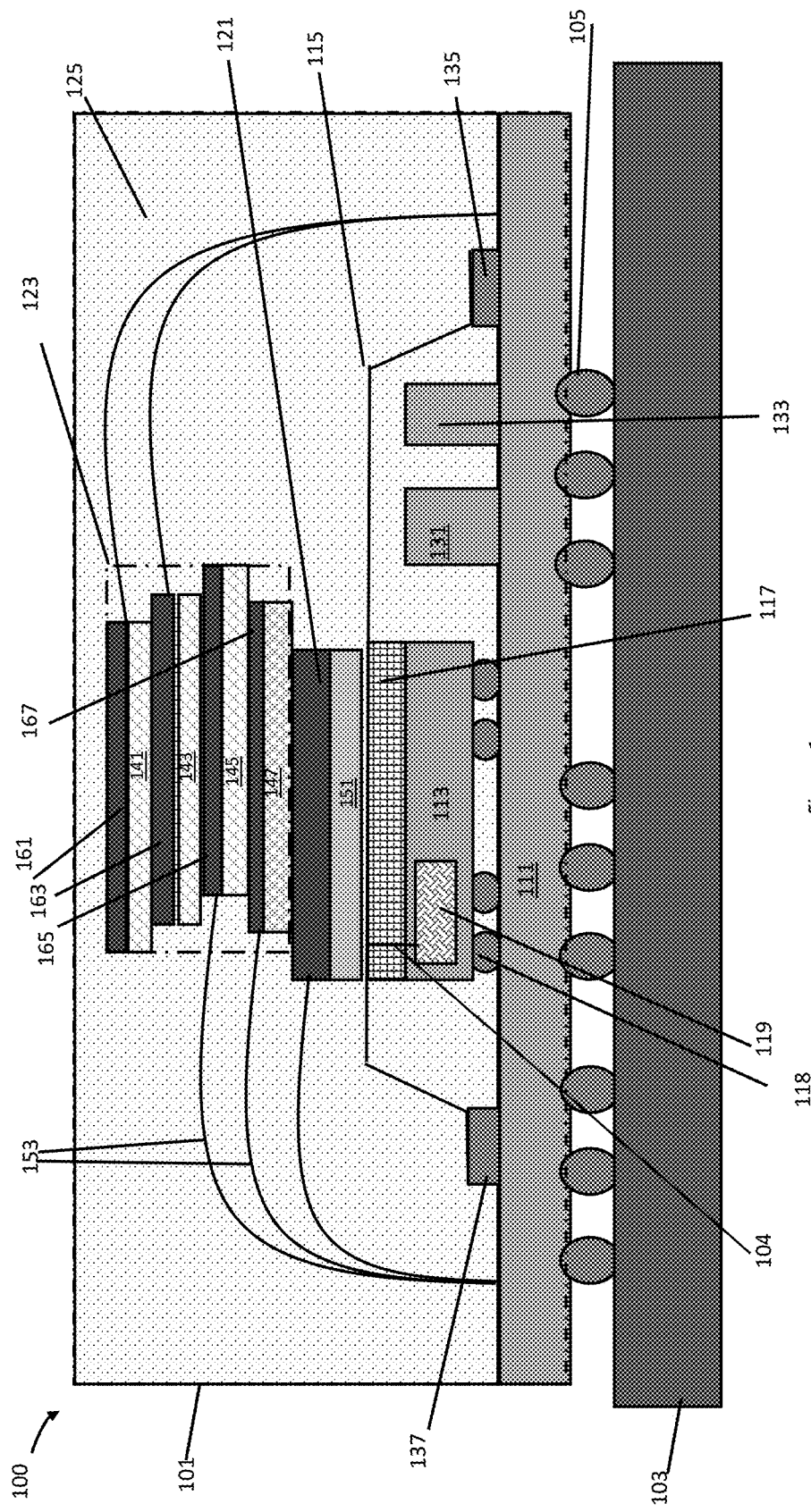
FIG. 1 schematically illustrates an electronic system including a circuit package attached to a printed circuit board (PCB), where the circuit package may include an integrated circuit (IC), and a leadframe disposed on the IC to conduct heat generated by the IC, while the leadframe may be electrically coupled with the IC, in accordance with various embodiments.

Embodiments herein may present techniques, methods, systems, and apparatuses that include a metal leadframe to thermally conduct heat from an integrated circuit (IC) that acts as a heat source, such as from a processor or an application specific integrated circuit (ASIC), to a substrate. Legacy solution may include using die attach film (DAF) as an insulation layer to increase thermal resistance between a hot IC that generates heat and adjacent ICs. Unfortunately, DAF insulation layers may also prevent the heat generated by the hot IC dissipating to a substrate. Embodiments herein may include a leadframe disposed on the IC to conduct heat generated by the IC to a package substrate. Since heat generated by an IC may be conduct to a package substrate by the leadframe, the leadframe may prevent heat generated by a hot IC from dissipating into adjacent ICs. Furthermore, the leadframe may be a part of an interconnect electrically coupled to a component of the IC. In doing so, the leadframe may perform dual functions as an electrical conductor and as a heat spreader. In addition, the leadframe may provide mechanical support for multiple ICs stacked on the leadframe.

In various embodiments, a circuit package may include a package substrate, and an IC attached to the package substrate. A leadframe may be disposed on the IC to conduct heat generated by the IC. In addition, the leadframe may be electrically coupled with the IC.

In various embodiments, an electronic system may include a printed circuit board (PCB); and a circuit package attached to the PCB. The circuit package may include a package substrate and an IC attached to the package substrate. The circuit package may further include a thermal material layer on the IC, and a leadframe on the thermal material layer. The leadframe may be a part of an interconnect of the circuit package, and the leadframe may be electrically coupled to a component of the IC.

In various embodiments, a method for forming a circuit package may include: providing a package substrate; attaching an IC to the package substrate; forming a thermal material layer on the IC; and forming a leadframe on the thermal material layer. In embodiments, the leadframe may be a part of an interconnect of the circuit package, and the leadframe may be electrically coupled to a component of the IC.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "electronic system" may include any type interconnected electronic devices, computer devices, or components thereof, and may be referred to as a "computer system," and/or "system." The term "computer device" or "computing device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management System (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices.

FIG. 1 schematically illustrates an electronic system 100 including a circuit package 101 attached to a PCB 103, where the circuit package 101 may include an IC 113, and a leadframe 115 disposed on the IC 113 to conduct heat generated by the IC 113, wherein the leadframe 115 may be electrically coupled with the IC 113, in accordance with various embodiments. For clarity, features of a circuit package, e.g., the circuit package 101, a PCB, e.g., the PCB 103, an IC, e.g., the IC 113, or a leadframe, e.g., the leadframe 115, may be described below as examples for understanding an example circuit package, a PCB, an IC, and/or a leadframe. It is to be understood that there may be more or fewer components within a circuit package, a PCB, an IC, and/or a leadframe. Further, it is to be understood that one or more of the components within the circuit package, the PCB, the IC, and/or the leadframe may include additional and/or varying features from the description below, and may include any device that one having ordinary skill in the art would consider and/or refer to as a circuit package, a PCB, an IC, and/or a leadframe.

In embodiments, the circuit package 101 may be attached to the PCB 103 through one or more connectors 105. The circuit package 101 may include a package substrate 111, and the IC 113 attached to the package substrate 111. The IC 113 may be electrically coupled to the package substrate 111 by interconnects, e.g., an interconnect 118, disposed between the IC 113 and the package substrate 111. In some embodiments, the interconnect 118 may be a solder bump. A thermal material layer 117 may be disposed on the IC 113, and the leadframe 115 on the thermal material layer 117. The leadframe 115 may conduct heat generated by the IC 113 to the package substrate 111. In addition, the leadframe 115 may be electrically coupled with the IC 113.

For example, the leadframe 115 may be a part of an interconnect of the circuit package 101, and electrically coupled 104 to a component 119 of the IC 113. Hence, the package substrate 111 may be coupled to the IC 113 by the interconnect 118 disposed between the IC 113 and the package substrate 111, and also by the leadframe 115.

The leadframe 115 may be further electrically coupled to a connector 135 on the package substrate 111 located at a first side of the IC 113, and electrically coupled to a connector 137 on the package substrate 111 located at a second side of the IC, opposite to the first side of the IC. Additional components, e.g., an IC 131, and a passive component 133 may be attached to the package substrate 111. The leadframe 115 may be on the IC 131 and the passive component 133, while the IC 131 and the passive component 133 may be enclosed between the first connector 135, the second connector 137, and the leadframe 115. The circuit package 101 may include a second IC 121 on the leadframe 115, separated by a DAF 151. The circuit package 101 may further include a stacked IC 123 on the second IC 121, wherein the stacked IC 123 may include a plurality of ICs separated by DAF, e.g., a DAF 141, a DAF 143, a DAF 145, a DAF 147. The plurality of ICs within the stacked IC 123 may be coupled to the package substrate 111 by various wire 153. In addition, components of the circuit package 101 may be covered by a mold 125.

In embodiments, the PCB 103 may mechanically support and electrically connect electronic components, e.g., the circuit package 101, using conductive tracks, pads and other features etched from copper sheets or other metal sheets laminated onto a non-conductive substrate. In embodiments, the PCB 103 may be a motherboard with expansion capability so that various components or packages may be attached to the PCB. For example, circuit packages attached to the PCB 103 may include peripherals, interface cards, TV tuner cards, or cards providing extra USB or FireWire slots. The PCB 103 may also include daughter cards attached to the PCB 103, where the daughter cards may include sound cards, video cards, network cards, hard drives, or other forms of persistent storage, or a variety of other custom components or packages. In some embodiments, the PCB 103 may be a mainboard, which may be a single board with limited or no additional expansion capability, such as controlling boards in laser printers, televisions, washing machines, or other embedded systems with limited expansion abilities.

In embodiments, the package substrate 111 may include a polymeric substrate, a non-polymeric substrate, a silicon substrate, a silicon on insulator (SOI) substrate, or a silicon on sapphire (SOS) substrate. Generally, a SOI substrate may include a layer of a semiconductor material such as silicon, germanium, silicon germanium, silicon germanium on insulator (SGOI), or combinations thereof. The package substrate 111 may include a multi-layered substrate, a gradient substrate, or a hybrid orientation substrate.

In embodiments, the IC 113, the IC 121, and/or the IC 131, may be a die or a wafer, and may include a processor circuitry, an interface circuitry, or any other circuitry. For example, the IC 113, the IC 121, and/or the IC 131, may include a processor, an application specific integrated circuit, a field-programmable gate array, a high-bandwidth memory, a package-embedded memory, a flash memory, an embedded nonvolatile memory, a graphics card, a III-V die, an accelerator, a low power double data rate memory (LPDDR), or any other circuitry. The stacked IC 123 may include one or more ICs that perform the same or similar operations as the other ICs. Each IC of the stacked IC 123, e.g., an IC 161, an IC 163, an IC 165, and an IC 167, may be separated by DAF, e.g., a DAF 141, a DAF 143, a DAF 145, or a DAF 147. In some embodiments, stacked IC 123 may include, for example, one or more NAND flash memory dies. While the circuit package 101 is described as including the IC 113, the IC 121, the IC 131, and the stacked IC 123, it is to be understood that the circuit package 101 may include more or fewer ICs in other embodiments, located in different positions. ICs, e.g., the IC 113, the IC 121, the IC 131, and the stacked IC 123, may be coupled to the package substrate or to each other by various wire 153, which may include conductive material.

In embodiments, the leadframe 115 may be include aluminum (Al), copper (Cu), tin (Sn), nickel (Ni), gold (Au), silver (Ag), tungsten (W), iron, steel, a combination of metal and alloy, or other electrically conductive material. The leadframe 115 may be a part of an interconnect of the circuit package 101, and may be electrically coupled 104 to the component 119 of the IC 113. The leadframe 115 may be further electrically coupled to the connector 135 and the connector 137 located on the package substrate 111. The connector 135 or the connector 137 may be a stud, a wire-bonding wire, a bump, a ball, a solder pillar, or a solder paste. The interconnect of the circuit package 101 may further include bumps or pillars, not shown for simplicity reasons. The interconnect of the circuit package 101, including the leadframe 115, may be configured to route electrical signals between ICs or between ICs and package substrates, or PCB. In some embodiments, the interconnect of the circuit package 101 may be configured to route electrical signals such as, for example, input/output (I/O) signals and/or power or ground signals associated with the operation of the IC 113.

In embodiments, the thermal material layer 117 may include an epoxy resin, a cyanoacrylate, a thermal grease, a thermal gel, a phase-change material, a polymer, a ceramic material, or DAF. In some embodiments, DAF may be applied to one or more sides of IC 113, the IC 121, and the plurality of ICs within the stacked IC 123, e.g., the DAF 141, the DAF 143, the DAF 145, the DAF 147, or the DAF 151. DAF may include die-attach films laminated directly to the ICs. In some embodiments, DAFs, e.g., the DAF 141, the DAF 143, the DAF 145, the DAF 147, the DAF 151, may include epoxy die attach, die attach paste, die attach tape, and/or some combination thereof. DAFs, e.g., the DAF 141, the DAF 143, the DAF 145, the DAF 147, the DAF 151, may provide thermal resistance. In some embodiments, DAFs, e.g., the DAF 141, the DAF 143, the DAF 145, the DAF 147, the DAF 151, may have a thickness in a range between approximately 1 micrometers and approximately 200 micrometers.

In embodiments, the mold 125 may at least partially encompass the IC 113, the IC 121, the IC 131, and the stacked IC 123. The mold 125 may be abutted on one side by the package substrate 111. The mold 125 may be rigid and may protect the IC 113, the IC 121, the IC 131, and the stacked IC 123, or some combination thereof, from damage. Further, the mold 125 may be an electrical insulator, preventing unintended electrical current transfer, via the mold 125, among the IC 113, the IC 121, the IC 131, and the stacked IC 123, or some combination thereof.

Figure 2:
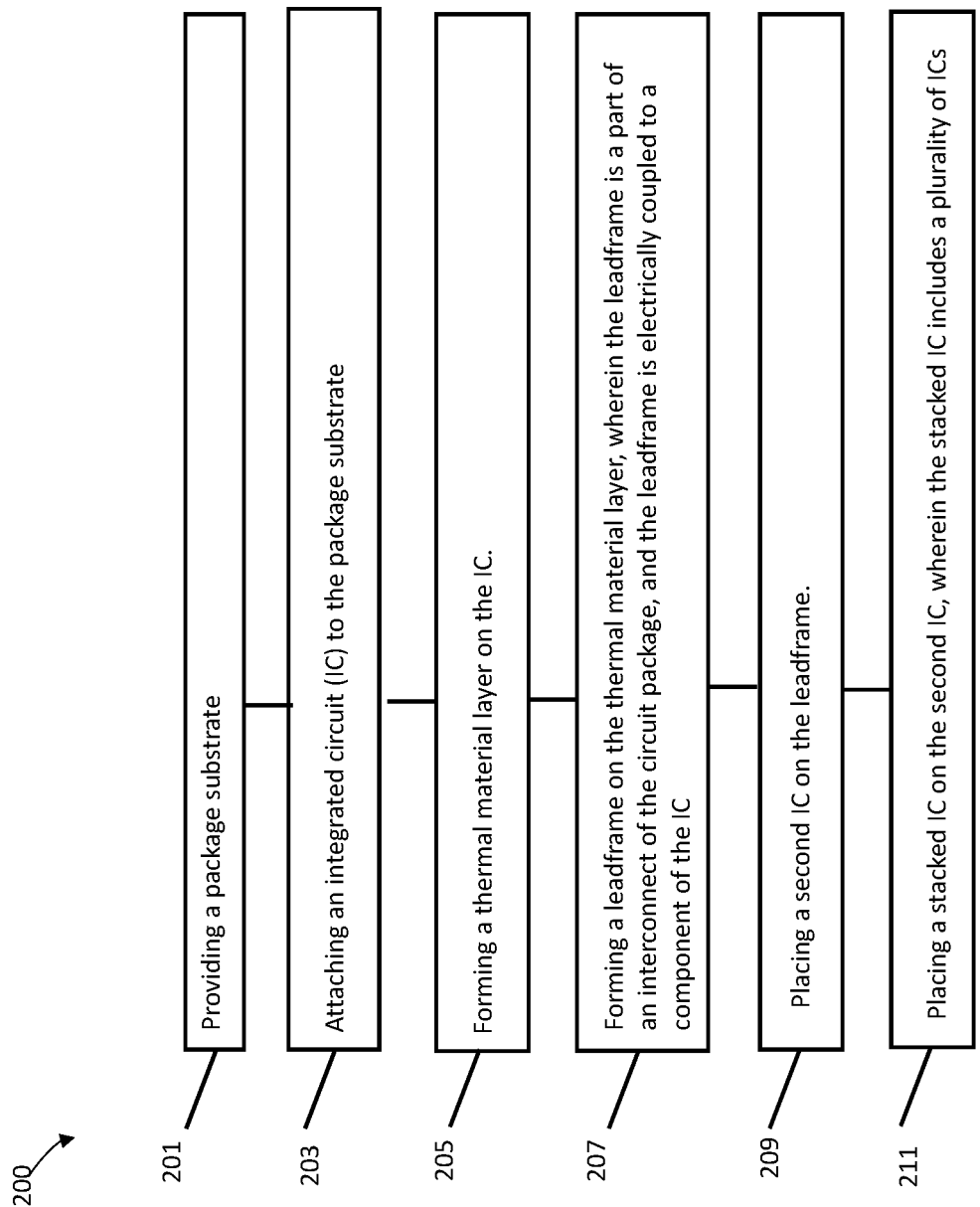
FIG. 2 illustrates an example process for forming a circuit package, where the circuit package may include an IC, and a leadframe disposed on the IC to conduct heat generated by the IC, while the leadframe may be electrically coupled with the IC, in accordance with various embodiments.

FIG. 2 illustrates an example process 200 for forming a circuit package, where the circuit package may include an IC, and a leadframe disposed on the IC to conduct heat generated by the IC, and the leadframe may be a part of an interconnect of the circuit package, in accordance with various embodiments. The details of the various stages of the process 200 may be illustrated in more details by FIGS. 3-7. The process 200 may be applied to make the circuit package 101 as shown in FIG. 1.

Figure 3:
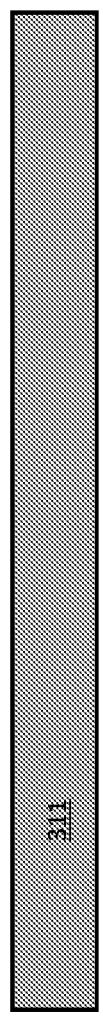
FIGS. 3-7 illustrate various stages of an example process for forming a circuit package, where the circuit package may include an IC, and a leadframe disposed on the IC to conduct heat generated by the IC, while the leadframe may be electrically coupled with the IC, in accordance with various embodiments.

In block 201, the process 200 may include providing a package substrate. For example, as shown in FIG. 3, a package substrate 311 may be provided. The package substrate 311 may be similar to the package substrate 111 in FIG. 1. In some embodiments, the package substrate 311 may include a polymeric substrate, a non-polymeric substrate, a silicon substrate, a silicon on insulator (SOI) substrate, or a silicon on sapphire (SOS) substrate. In some embodiments, the package substrate 311 may have a width or length in a range of about 100 mm to about 500 mm.

Figure 4:
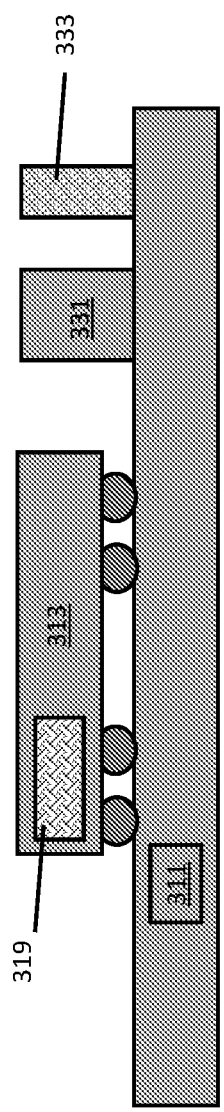

In block 203, the process 200 may include attaching an IC to the package substrate. For example, as shown in FIG. 4, an IC 313 may be attached to the package substrate 311. The IC 313 may be similar to the IC 113 in FIG. 1. In addition, other components, such as an IC 331 and a passive component 333 may be attached to the package substrate 311. The IC 313 and/or the IC 331, may be a die or a wafer. The IC 313 and/or the IC 331 may be a processor, an application specific integrated circuit, a field-programmable gate array, a high-bandwidth memory, a package-embedded memory, a flash memory, an embedded nonvolatile memory, a graphics card, a III-V die, an accelerator, a low power double data rate memory (LPDDR), or any other circuits. The IC 313 may include a component 319, which may include an active device, e.g., a transistor.

Figure 5:
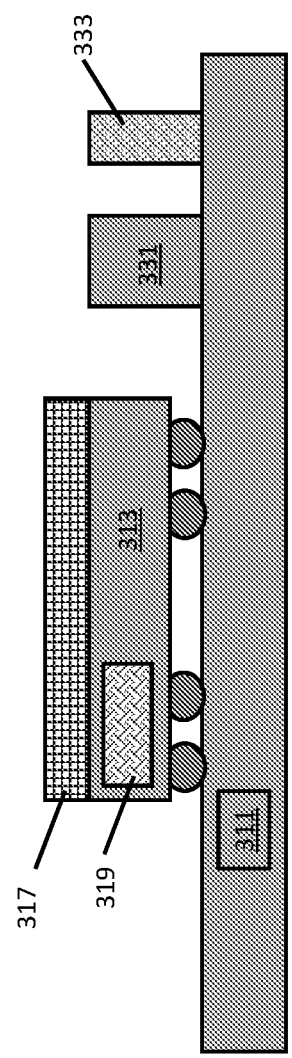

In block 205, the process 200 may include forming a thermal material layer on the IC. For example, as shown in FIG. 5, a thermal material layer 317 may be formed on the IC 313. The thermal material layer 317 may be similar to the thermal material layer 117 in FIG. 1. In some embodiments, the thermal material layer 317 may include an epoxy resin, a cyanoacrylate, a thermal grease, a thermal gel, a phase-change material, a polymer, a ceramic material, or DAF.

Figure 6:
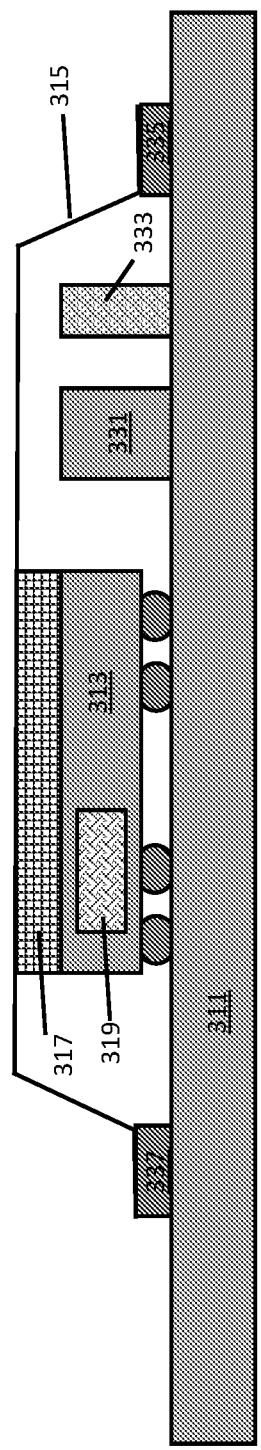

In block 207, the process 200 may include forming a leadframe on the thermal material layer, wherein the leadframe is a part of an interconnect of the circuit package, and the leadframe is electrically coupled to a component of the IC. For example, as shown in FIG. 6, a leadframe 315 may be formed on the thermal material layer 317. The leadframe 315 may be a part of an interconnect of the circuit package, and the leadframe 315 may be electrically coupled to the component 319 of the IC 313. The leadframe 315 may further be electrically coupled to a connector 335 and a connector 337 located on the package substrate 311. The connector 335 or the connector 337 may be a stud, a wire-bonding wire, a bump, a ball, or a solder pillar. The leadframe 315 may be on the IC 331 and the passive component 333, while the IC 331 and the passive component 333 may be enclosed between the connector 335, the connector 337, and the leadframe 315. Additional operations, e.g., reflow, may be performed before or after leadframe is formed. Thermal interface material (TIM), DAF, or adhesive may be applied on the bottom of leadframe to sustain it flat.

Figure 7:
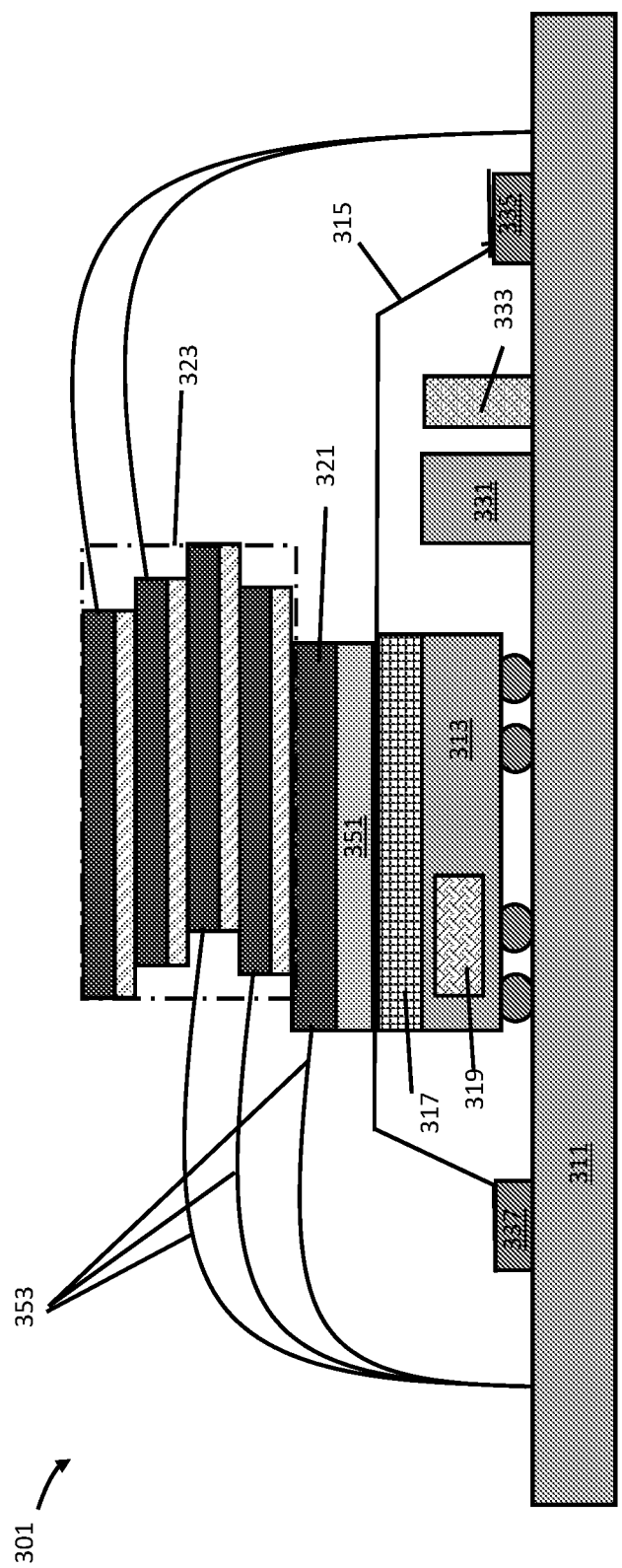

In block 209, the process 200 may include placing a second IC on the leadframe. For example, as shown in FIG. 7, a second IC, e.g., an IC 321, may be placed on the leadframe 315, to form a circuit package 301. The IC 321 may be similar to the IC 121 in FIG. 1. In some embodiments, the IC 321 may be a processor, an application specific integrated circuit, a field-programmable gate array, a high-bandwidth memory, a package-embedded memory, a flash memory, an embedded nonvolatile memory, a graphics card, a III-V die, an accelerator, a low power double data rate memory (LPDDR), or any other circuits. The IC 321 may be coupled to the package substrate 311 by a wire 353.

In block 211, the process 200 may include placing a stacked IC on the second IC, wherein the stacked IC includes a plurality of ICs. For example, as shown in FIG. 7, a stacked IC 323 may be placed on the IC 321. The stacked IC 323 may be similar to the stacked IC 123 in FIG. 1. In some embodiments, the stacked IC 323 may include one or more ICs that perform the same or similar operations as the other ICs. Each IC of the stacked IC 123 may be separated by DAF. In some embodiments, the stacked IC 323 may include, for example, one or more NAND flash memory dies. ICs within the stacked IC 323 may be coupled to the package substrate 311 by a wire 353.

Furthermore, other operations, e.g., molding, ball attachment, and singulation process, not shown, may be performed on the circuit package 301, following the operations shown in the process 200.

Figure 8:
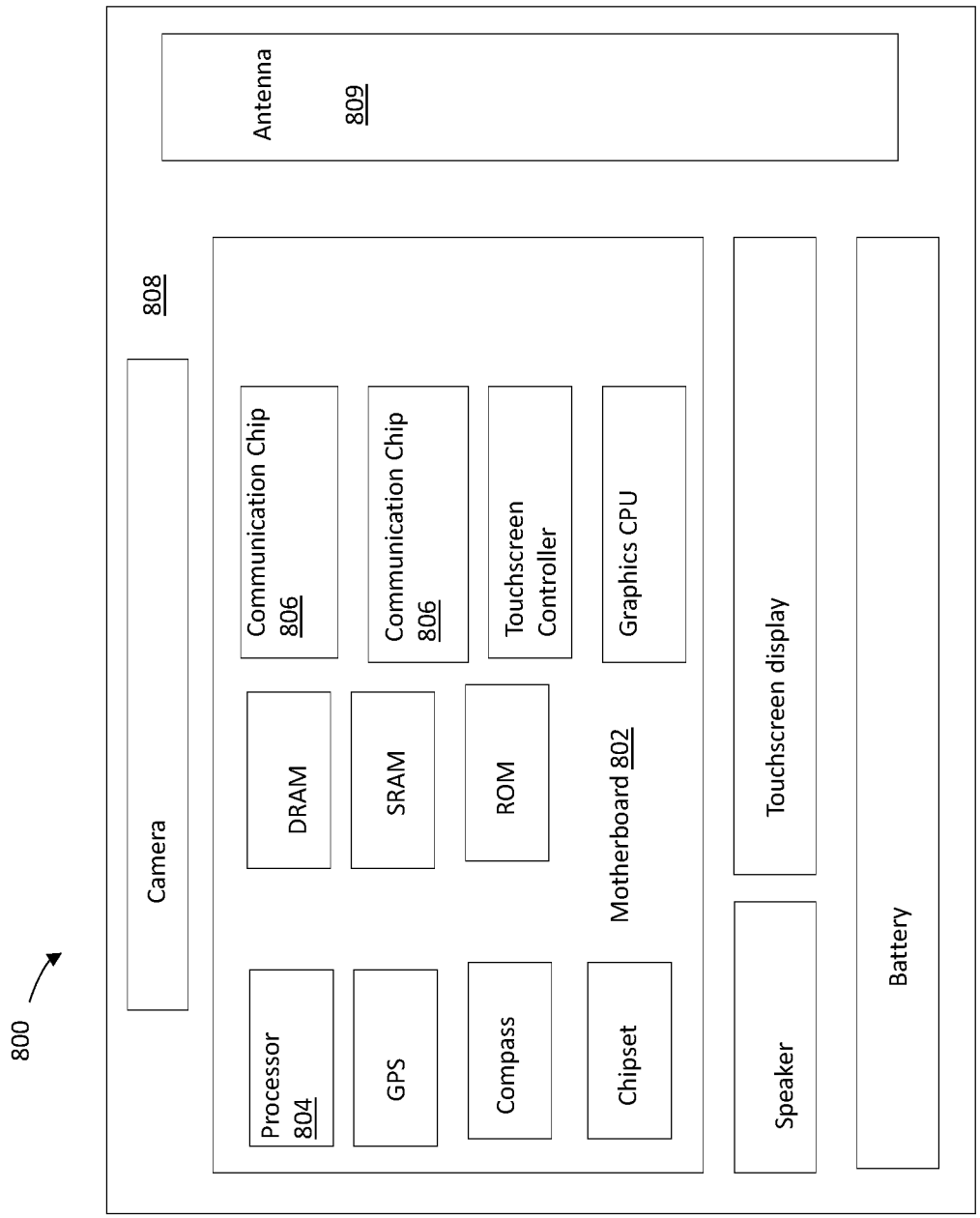
FIG. 8 illustrates an example system configured to employ the apparatuses and methods described herein, in accordance with various embodiments.

FIG. 8 illustrates an example system 800 configured to employ the apparatuses and methods described herein (e.g., the electronic system 100 including the circuit package 101 in FIG. 1, or a circuit package formed by the process 200 in FIG. 2, the circuit package 301 in FIG. 7), in accordance with various embodiments.

Components of the system 800 may be housed in an enclosure (e.g., housing 808). The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, the system 800 may include other components that may or may not be physically and electrically coupled to the motherboard 802. These other components may include, but are not limited to, volatile memory, e.g., static random access memory (SRAM) or dynamic random access memory (DRAM), non-volatile memory (e.g., ROM), flash memory, a graphics central processing unit (CPU), a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

In embodiments, the processor 804, the communication chip 806, the DRAM, or other components may be included in a circuit package, such as the circuit package 101 shown in FIG. 1, while the motherboard 802 may be similar to the PCB 103 shown in FIG. 1.

The communication chip 806 may enable wireless communications for the transfer of data to and from the system 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.).

IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The system 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

In various implementations, the system 800 may be a system in package (SIP), which may be any one of a number of mobile and/or non-mobile client or edge devices. A mobile client device may include, but is not to be limited to, for example, a laptop computer, an ultra-laptop computer, a tablet, a touch pad, a portable computer, a handheld computer, a wearable device, a palmtop computer, a personal digital assistant (PDA), an e-reader, a cellular telephone, a combination cellular telephone/PDA, a mobile smart device (e.g., a smart phone, a smart tablet, etc.), a mobile internet device (MID), a mobile messaging device, a mobile data communication device, a mobile media playing device, a camera, a mobile gaming console, etc. A non-mobile client or edge devices may include, but is not to be limited to, for example, a personal computer (PC), a television, a smart television, a data communication device, a media playing device, a gaming console, a gateway, an Internet of Things (TOT) device, etc. The system 800 may include controllers (or processors) and other components that execute software and/or control hardware to execute local programs or consume services provided by external service providers over a network. For example, the system 800 may include one or more software clients or applications that run locally and/or utilize or access web-based services (e.g., online stores or services, social networking services, etc.). The system 800 may also, or instead, include a web interface running in a browser from which the electronic apparatus can access such web-based services. The system 800 may also include storage devices to store logic and data associated with the programs and services used by the system 800.

Some Non-Limiting Examples are Presented Below.

Example 1 may include a circuit package comprising: a package substrate; an integrated circuit (IC) attached to the package substrate; and a leadframe disposed on the IC to conduct heat generated by the IC, wherein the leadframe is electrically coupled with the IC.

Example 2 may include the circuit package of example 1 and/or some other examples herein, wherein the IC is electrically coupled to the package substrate by interconnects disposed between the IC and the package substrate.

Example 3 may include the circuit package of any of examples 1-2 and/or some other examples herein, wherein the leadframe includes copper, aluminum, tin, nickel, gold, silver, iron, steel, or a combination of metal and alloy.

Example 4 may include the circuit package of any of examples 1-2 and/or some other examples herein, wherein the IC is a processor, an application specific integrated circuit, a field-programmable gate array, a high-bandwidth memory, a package-embedded memory, a flash memory, an embedded nonvolatile memory, a graphics card, a III-V die, an accelerator, or a low power double data rate memory (LPDDR).

Example 5 may include the circuit package of any of examples 1-2 and/or some other examples herein, wherein the package substrate includes a polymeric substrate, a non-polymeric substrate, a silicon substrate, a silicon on insulator (SOI) substrate, or a silicon on sapphire (SOS) substrate.

Example 6 may include the circuit package of any of examples 1-2 and/or some other examples herein, wherein the IC includes a die or a wafer.

Example 7 may include the circuit package of any of examples 1-2 and/or some other examples herein, further comprising: a thermal material layer disposed between the IC and the leadframe.

Example 8 may include the circuit package of example 7 and/or some other examples herein, wherein the thermal material layer include an epoxy resin, a cyanoacrylate, a thermal grease, a thermal gel, a phase-change material, a polymer, a ceramic material, or die attach film (DAF).

Example 9 may include the circuit package of any of examples 1-2 and/or some other examples herein, wherein the leadframe is further electrically coupled to a first connector on the package substrate located at a first side of the IC, and electrically coupled to a second connector on the package substrate located at a second side of the IC, wherein the first side of the IC is opposite to the second side of the IC.

Example 10 may include the circuit package of example 9 and/or some other examples herein, wherein the first connector or the second connector is a stud, a wire-bonding wire, a bump, a ball, or a solder pillar.

Example 11 may include the circuit package of example 9 and/or some other examples herein, further comprising: a passive component attached to the package substrate, wherein the leadframe is on the passive component, and the passive component is enclosed between the first connector, the second connector, and the leadframe.

Example 12 may include the circuit package of any of examples 1-2 and/or some other examples herein, further including: a second IC on the leadframe, wherein the second IC is a processor, an application specific integrated circuit, a field-programmable gate array, a high-bandwidth memory, a package-embedded memory, a random access memory, a flash memory, an embedded nonvolatile memory, a graphics card, a III-V die, an accelerator, or a low power double data rate memory (LPDDR).

Example 13 may include the circuit package of example 12 and/or some other examples herein, further including: a stacked IC on the second IC, wherein the stacked IC includes a plurality of ICs.

Example 14 may include an electronic system, comprising: a printed circuit board (PCB); and a circuit package attached to the PCB, wherein the circuit package comprises: a package substrate; an integrated circuit (IC) attached to the package substrate; a thermal material layer on the IC; and a leadframe on the thermal material layer, wherein the leadframe is a part of an interconnect of the circuit package, and the leadframe is electrically coupled to a component of the IC.

Example 15 may include the electronic system of example 14 and/or some other examples herein, wherein the leadframe includes copper, aluminum, tin, nickel, gold, silver, iron, steel, or a combination of metal and alloy.

Example 16 may include the electronic system of any of examples 14-15 and/or some other examples herein, wherein the thermal material layer include an epoxy resin, a cyanoacrylate, a thermal grease, a thermal gel, a phase-change material, a polymer, a ceramic material, or die attach film (DAF).

Example 17 may include the electronic system of any of examples 14-15 and/or some other examples herein, wherein the IC is a processor, an application specific integrated circuit, a field-programmable gate array, a high-bandwidth memory, a package-embedded memory, a flash memory, an embedded nonvolatile memory, a graphics card, a III-V die, an accelerator, or a low power double data rate memory (LPDDR).

Example 18 may include the electronic system of any of examples 14-15 and/or some other examples herein, wherein the leadframe is further electrically coupled to a first connector on the package substrate located at a first side of the IC, and electrically coupled to a second connector on the package substrate located at a second side of the IC, wherein the first side of the IC is opposite to the second side of the IC.

Example 19 may include the electronic system of example 18 and/or some other examples herein, wherein the first connector or the second connector is a stud, a wire-bonding wire, a bump, a ball, or a solder pillar.

Example 20 may include the electronic system of any of examples 14-15 and/or some other examples herein, further including: a second IC on the leadframe, wherein the second IC is a processor, an application specific integrated circuit, field-programmable gate array, a high-bandwidth memory, a package-embedded memory, a random access memory, a flash memory, an embedded nonvolatile memory, a graphics card, a III-V die, an accelerator, or a low power double data rate memory (LPDDR).

Example 21 may include a method for forming a circuit package, comprising: providing a package substrate; attaching an integrated circuit (IC) to the package substrate; forming a thermal material layer on the IC; and forming a leadframe on the thermal material layer, wherein the leadframe is a part of an interconnect of the circuit package, and the leadframe is electrically coupled to a component of the IC.

Example 22 may include the method of example 21 and/or some other examples herein, wherein the IC is a first IC, and the method further comprises: placing a second IC on the leadframe.

Example 23 may include the method of example 22 and/or some other examples herein, further including: placing a stacked IC on the second IC, wherein the stacked IC includes a plurality of ICs.

Example 24 may include the method of any of examples 21-23 and/or some other examples herein, wherein the leadframe includes copper, aluminum, tin, nickel, gold, silver, iron, steel, or a combination of metal and alloy.

Example 25 may include the method of any of examples 21-23 and/or some other examples herein, wherein the thermal material layer include an epoxy resin, a cyanoacrylate, a thermal grease, a thermal gel, a phase-change material, a polymer, a ceramic material, or die attach film (DAF).

Although certain embodiments have been illustrated and described herein for purpose of description, this application is intended to cover any adaptations or variations of the embodiments discussed herein. Therefore, it is manifestly intended that embodiments described herein be limited only by the claims.

What is claimed is:

1. A circuit package comprising:
   a package substrate;
   an integrated circuit (IC) attached to the package substrate; and
   a leadframe disposed on the IC to conduct heat generated by the IC, wherein the leadframe is electrically coupled with the IC, and is further electrically coupled to a first connector on the package substrate located at a first side of the IC, and electrically coupled to a second connector on the package substrate located at a second side of the IC, wherein the first side of the IC is opposite to the second side of the IC.

2. The circuit package of claim 1, wherein the IC is electrically coupled to the package substrate by interconnects disposed between the IC and the package substrate.

3. The circuit package of claim 1, wherein the leadframe includes at least one of: copper, aluminum, tin, nickel, gold, silver, iron, and steel.

4. The circuit package of claim 1, wherein the IC is a processor, an application specific integrated circuit, a field-programmable gate array, a high-bandwidth memory, a package-embedded memory, a flash memory, an embedded nonvolatile memory, a graphics card, a III-V die, an accelerator, or a low power double data rate memory (LPDDR).

5. The circuit package of claim 1, wherein the package substrate includes a polymeric substrate, a silicon substrate, a silicon on insulator (SOI) substrate, or a silicon on sapphire (SOS) substrate.

6. The circuit package of claim 1, wherein the IC includes a die or a wafer.

7. The circuit package of claim 1, further comprising:
   a thermal material layer disposed between the IC and the leadframe.

8. The circuit package of claim 7, wherein the thermal material layer include an epoxy resin, a cyanoacrylate, a thermal grease, a thermal gel, a phase-change material, a polymer, a ceramic material, or die attach film (DAF).

9. The circuit package of claim 1, further comprising: a passive component attached to the package substrate, wherein the leadframe is on the passive component, and the passive component is enclosed between the first connector, the second connector, and the leadframe.

10. The circuit package of claim 1, further including:
    a second IC on the leadframe, wherein the second IC is a processor, an application specific integrated circuit, a field-programmable gate array, a high-bandwidth memory, a package-embedded memory, a random access memory, a flash memory, an embedded nonvolatile memory, a graphics card, a III-V die, an accelerator, or a low power double data rate memory (LPDDR).

11. The circuit package of claim 10, further including:
    a stacked IC on the second IC, wherein the stacked IC includes a plurality of ICs.

12. An electronic system, comprising:
a printed circuit board (PCB);
a circuit package attached to the PCB, wherein the circuit package comprises:
  a package substrate;
  an integrated circuit (IC) attached to the package substrate;
  a thermal material layer on the IC; and
  a leadframe on the thermal material layer, wherein the leadframe is a part of an interconnect of the circuit package, and the leadframe is electrically coupled to a component of the IC; and
a second IC on the leadframe, wherein the second IC is a processor, an application specific integrated circuit, field-programmable gate array, a high-bandwidth memory, a package-embedded memory, a random access memory, a flash memory, an embedded nonvolatile memory, a graphics card, a III-V die, an accelerator, or a low power double data rate memory (LPDDR).

13. The electronic system of claim 12, wherein the leadframe includes at least one of: copper, aluminum, tin, nickel, gold, silver, iron, and steel.

14. The electronic system of claim 12, wherein the thermal material layer include an epoxy resin, a cyanoacrylate, a thermal grease, a thermal gel, a phase-change material, a polymer, a ceramic material, or die attach film (DAF).

15. The electronic system of claim 12, wherein the IC is a processor, an application specific integrated circuit, a field-programmable gate array, a high-bandwidth memory, a package-embedded memory, a flash memory, an embedded nonvolatile memory, a graphics card, a III-V die, an accelerator, or a LPDDR.

16. The electronic system of claim 12, wherein the leadframe is further electrically coupled to a first connector on the package substrate located at a first side of the IC, and electrically coupled to a second connector on the package substrate located at a second side of the IC, wherein the first side of the IC is opposite to the second side of the IC.

17. A method for forming a circuit package, comprising:
providing a package substrate;
attaching a first integrated circuit (IC) to the package substrate;
forming a thermal material layer on the first IC;
forming a leadframe on the thermal material layer, wherein the leadframe is a part of an interconnect of the circuit package, and the leadframe is electrically coupled to a component of the IC; and
placing a second IC on the leadframe.

18. The method of claim 17, further including:
placing a stacked IC on the second IC, wherein the stacked IC includes a plurality of ICs.

19. The method of claim 17, wherein the leadframe includes at least one of: copper, aluminum, tin, nickel, gold, silver, iron, and steel.

20. The method of claim 17, wherein the thermal material layer include an epoxy resin, a cyanoacrylate, a thermal grease, a thermal gel, a phase-change material, a polymer, a ceramic material, or die attach film (DAF).

* * * * *